Nov. 7, 1967 E. GERUM 3,351,834
COMPENSATED TRANSISTORIZED ELECTRIC CLOCK CIRCUIT
Filed May 31, 1966 2 Sheets-Sheet 1

INVENTOR
Erich Gerum

By Walter Becker

Nov. 7, 1967 E. GERUM 3,351,834

COMPENSATED TRANSISTORIZED ELECTRIC CLOCK CIRCUIT

Filed May 31, 1966 2 Sheets-Sheet 2

INVENTOR
Erich Gerum

By Walter Becker

United States Patent Office 3,351,834

Patented Nov. 7, 1967

3,351,834

COMPENSATED TRANSISTORIZED ELECTRIC CLOCK CIRCUIT

Erich Gerum, Rothenbach (Pegnitz), Germany, assignor to Diehl, Nurnberg, Germany Filed May 31, 1966, Ser. No. 554,165
Claims priority, application Germany, July 9, 1962, D 39,870
8 Claims. (Cl. 318—132)

ABSTRACT OF THE DISCLOSURE

Transistorized electronic clock drive in which a bias is supplied from the load circuit via a diode to the base of the transistor which is opposite in polarity to the control pulses which are supplied to the base and wherein the diode is substantially nonconductive below a predetermined voltage thereacross while the diode resistance drops rapidly after becoming conductive whereby the control voltage at the transistor base varies inversely as the voltage of a battery in the load circuit and thereby provides for substantially uniform drive pulses throughout the useful life of the battery.

This is a continuation-in-part application of my copending patent application Ser. No. 286,220, filed June 7, 1963, and entitled, "Compensated Transistorized Electric Clock Circuit," and now abandoned.

The present invention relates to transistor circuit amplifiers especially for application in self-regulating clock drives.

Transistors, junction transistors in particular, are employed to an increasing degree in circuit amplifiers because of their advantageous properties. They can for example be used with advantage in electrical impulse or oscillation generators and also as active amplying elements in connection with rotating or oscillating mechanical systems in order to maintain an oscillating or rotary movement. They are, among other things, also employed as circuit amplifiers in self-regulating clock drives.

It is known, for example, for a transistor circuit amplifier to be provided for the maintenance of a mechanical oscillation or rotary movement, in which a control coil has been provided between the base and emitter of the transistor and an operating coil has been provided between the collector and the emitter of the transistor and in which, in series with the operating or working coil, a direct current source, in particular a dry battery, is positioned. In this way, a voltage impulse produced in the control coil develops an amplified impulse in the working coil, which impulse can be employed for the maintenance of the oscillation or rotary movement. Such a system can either, via permanent magnets, operate a movement regulator, for example a pendulum or a balance wheel, but it can also, preferably in connection with permanent magnets, form the driving system of a periodically or permanently rotating motor which, for example via a buffer spring, is utilized for the drive of a clock.

In all these cases, the problem is to drive a clock for a long period of time by means of a dry battery, in particular a single cell while the current in the working coil must be kept as constant as possible. This requirement cannot be fulfilled in a simple manner with the transistor circuits existing today. The reason for this lies primarily in the fact that, in the already-known circuit amplifiers equipped with a transistor, the emitter current or the collector current is to a great extent dependent upon the voltage applied to the transistor and upon the temperature. As long as it is fresh, the operating voltage of a dry battery amounts to about 1.7 volts, but decreases with increasing exhaustion and age, at a still-sufficient current supply, to about 0.8 volt. Also, in a living room, the temperature varies between about 10 and 30 degrees centigrade. The change evoked by these influences in the emitter current or collector current of the transistor causes changes in the drive-performance which encroach upon the time-constant of such installations and make necessary more or less expensive and complicated compensating devices.

In a transistor circuit amplifier of the type described above, it is already known for so-called NTC resistors to be connected parallel to the feed impedance, which resistors have the property of being able to decrease their resistance with increasing temperature. Also, a diode has been connected in series to one or more of these NTC resistors. The temperature compensation effected by these NTC resistors, however, is insufficient, and the effect of the diode connected in series thereto is negligibly slight. Further, the means suggested has no effect whatever on the tendency of the operating voltage to decrease in the course of time. Additional measures must consequently be taken here in relation to the clock to compensate for the harmful effect of the decrease in the operating voltage.

It is, therefore, an object of the present invention to provide a transistor circuit amplifier especially for operating self-regulating clock drives which will overcome the disadvantages outlined above.

It is a further object of the present invention to provide a transistor circuit as set forth in the preceding paragraph, in which the current in the operating or working coil will be held approximately constant.

It is still another object of the present invention to provide a transistor circuit of the type set forth in the preceding paragraphs, in which the emitter or collector current will not be dependent on the variable voltage of the voltage source, and will not be dependent on the temperature of the transistor.

These and other objects and advantages of the present invention will appear more clearly from the following specification in connection with the accompanying drawings in which.

Figure 3:
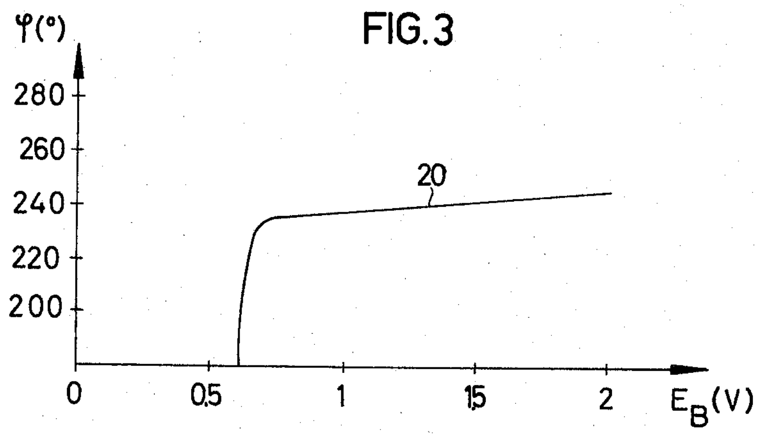
FIG. 3 is a diagram showing the dependence of the angle of rotation $\varphi$ of a balance oscillator according to FIG. 2 upon the battery voltage.

The present invention is based on a transistor circuit amplifier, especially for employment with self-regulating clock drives, in which first, in the load circuit of the amplifier, a non-constant direct current source, more particularly a dry battery, has been provided as the source of energy, in which secondly a control coil has been provided between the base and the emitter of the transistor, and in which thirdly the circuit impulses produced in the load circuit serve to drive a mechanically oscillating or rotating system through the movement of which control impulses are periodically fed to the transistor.

In order to avoid the disadvantages referred to, it is suggested, according to the invention, to arrange in the load circuit a voltage divider having a relatively low ohmic resistance and to connect in between the base of the transistor and a point of the voltage divider, a voltage-dependent resistor, especially a semi-conductor having an exponential current-voltage characteristic.

More specifically, the voltage-dependent resistor will, above a certain terminal voltage and thereby above a predetermined lower limit voltage of the direct voltage source, form a relatively low ohmic shunt to the base-emitter-diode or to the collector-base-diode of the transistor, and thereby to the partial resistance of the voltage divider arranged in series therewith. It is essential for the present invention that a diode connected to the base and a point of the working or load circuit will become conductive above a certain lower limit voltage of the direct voltage source and will impart upon the base of the transistor a blocking potential force dependent on the magnitude of the current in the load circuit. Therefore, if the current in the load circuit tends to increase, the transistor will be blocked to a correspondingly greater extent. Consequently, the load current will be held constant for all practical purposes within a wide range.

The voltage-dependent resistor may consist of a semi-conductor diode with a pronounced bend in the current-voltage-characteristic curve, said diode being poled in the same direction as the emitter-base-path of the transistor and connected to the base of the transistor and a tapping of the voltage divider.

If the transistor circuit amplifier operates in an emitter circuit, a resistor may be provided in the emitter feeding line of the transistor to which the diode is connected at a suitable location. This resistor, however, may be dispensed with if the working coil provided in the collector circuit of the transistor is designed as voltage divider, preferably in such a way that the diode is connected to a tapping of the working coil.

A particularly favorable circuit with a high degree of efficiency is obtained if the working coil of the circuit amplifier is located completely or to a major extent in the emitter feeding line and if it forms simultaneously the voltage divider for the connection with the diode.

It is particularly favorable to make the impedance of the control coil greater than that of the working coil and also to make the ohmic resistance of the control coil greater than that of the voltage divider or that of the working coil designed as voltage divider.

Figure 1:
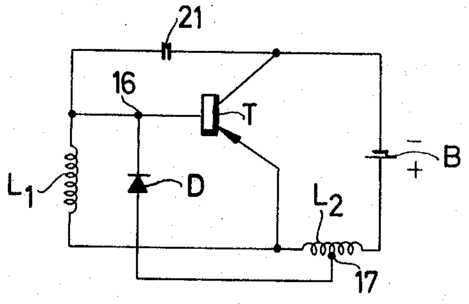
FIG. 1 shows a transistor circuit amplifier in accordance with the invention in an emitter circuit.

Referring now to the drawings in detail, in FIG. 1, T designates a pnp-junction transistor in the control circuit of which between the base and the emitter there is provided a control coil $L_1$. Between the collector and the emitter of transistor T there is arranged an operating or driving coil $L_2$ in series with a direct voltage source B. Coil $L_2$ has a terminal or tapping 17 between its ends.

A condenser 21 interposed between the collector and the base of transistor T serves for suppressing self-excitation of the circuit. According to the invention, a diode D is provided between tapping 17 of operating or working coil $L_2$ and a point 16 of the base feeding line of the transistor T. Diode D is poled in the same direction as the emitter-base connection of transistor T.

Figure 2:
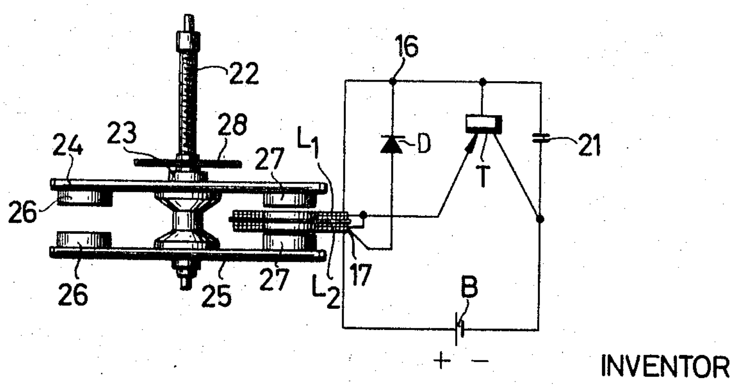
FIG. 2 shows a balance oscillator in connection with the circuit amplifier illustrated in FIG. 1.

As will be seen in FIG. 2, the circuit of FIG. 1 is arranged in association with a balance oscillating member 23 forming the input member of an electric clockwork. Member 23, which is under the influence of a spiral spring 28 is intended to drive a clock hand mechanism, for instance, via a drive worm 22. Member 23 has two spaced parallel arms 24, 25 having their ends provided with permanent magnets 27 and balance weights 26. Member 23 is mounted for oscillation on an axis lateral of control coil $L_1$ and the operating coil $L_2$ arranged coaxially thereto, with the ends of arms 24 and 25 arranged to pass across the coils.

Since no particular bias voltage prevails at the base of transistor T, the transistor T is normally blocked. The inductive feed-back present between the coils $L_1$, $L_2$ is in a manner known per se compensated by the capacitive feed-back caused by condenser 21, whereby a self-excitation of the circuit amplifier is prevented. The emitter-collector-path of transistor T will thus become conductive only when the parmanent magnets 27 of oscillating member 23 move across coils $L_1$, $L_2$, In view of the control impulse induced in this way in control coil $L_1$ and consisting of a positive and a negative half-wave, transistor T will be opened if a negative potential prevails at its base. In this instance, a working impulse flows through working coil $L_2$ so that the permanent magnets 27 and thereby the oscillating member 23 will be driven magnetically. When the permanent magnets 27 are no longer located above coils $L_1$, $L_2$, transistor T will return to its blocked condition. With each half-oscillation of member 23, in control coil $L_1$ a control impulse with a positive and a negative half-wave will be induced so that also with each half-oscillation a working impulse of working coil $L_2$ will drivingly act upon oscillating member 23. Thus, oscillating member 23 will oscillate about its zero position.

In a circuit having no diode D the magnitude of the driving impulse will depend to a considerable extent on the magnitude of the voltage of direct voltage source B since with each different voltage a different working current will flow in the working circuit of transistor T. However, if a diode D is provided in the circuit in accordance with the present invention, the working current will be held constant for all practical purposes within a wide range of values of the voltage of direct voltage source B.

As to the operation of diode D, it may be assumed that the voltage of the direct voltage source B exceeds a lower limit of, for instance, 1 volt. The location of terminal 17 along working coil $L_2$ is so selected that when transistor T is in a conductive state, the voltage at diode D, which voltage is composed of the control voltage and the voltage on the left-hand side of the working coil $L_2$, will be above the said lower limit of the voltage of the source B, for instance, 1 volt, exceed the threshold voltage of diode D so that diode D will become conductive. Since the emitter of transistor T, when transistor T is in a conductive state, is practically connected to the minus pole of direct voltage source B, the potential of point 17 and, since diode D is conductive, also the potential of point 16 and consequently also the potential of the base will be positive with regard to the potential of the emitter.

A positive potential at the base of a pnp-transistor means that the transistor is being blocked. When the voltage of the direct voltage source B is increased and when the working current tends also to increase, the potential drop on the left-hand part of the operating coil $L_2$ also tends to increase and point 17 and, thus, point 16 will become more positive so that the transistor T will be blocked to a still greater extent. Thus, the working current can practically not increase.

Above the lower limit value of, for instance, 1 volt of the direct voltage source B at which diode D becomes conductive, the working current and thus the voltage on the working coil $L_2$ will be held practically constant since transistor T will be controlled by diode D in such a way that the voltage on the emitter-collector-path of transistor T will for all practical purposes be equal to the difference between the lower limit voltage, for instance, 1 volt and the actual voltage of the direct voltage source B. Consequently, the magnitude of the driving impulses acting upon oscillating member 23, and thus the amplitude of oscillating member 23 will for all voltage values of source B above the lower limit value, remain practically constant, as will be evident from FIG. 3.

In FIG. 3, curve 20 illustrates the dependency of the angle of rotation $\varphi$ of the balance oscillating member 23 on the battery voltage $E_B$. This curve clearly shows that the angle $\varphi$ of oscillating member 23 above a voltage $E_B$ of 1 volt changes only slightly and within the range involved, viz. of from 1 volt to 1.7 volts, is substantially constant.

Figures 4, 5, 6, 7:
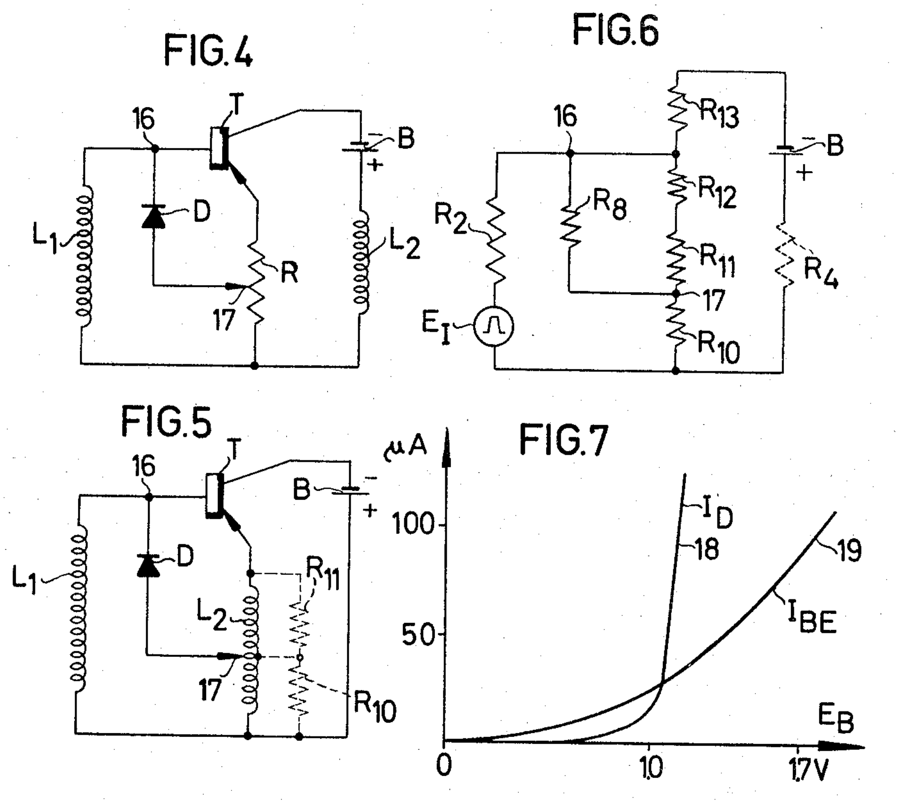
FIG. 4 shows a further circuit amplifier in accordance with the invention, with a voltage divider in the emitter feed of the transistor.
FIG. 5 shows a circuit amplifier similar to that of FIG. 4, in which the voltage divider and the operating coil are combined with each other.
FIG. 6 is an equivalent circuit diagram for the circuit amplifier according to FIGS. 4 and 5.
FIG. 7 is a diagram of current-voltage-curves in explanation of the circuits shown in FIGS. 4 and 5.

As to the modification shown in FIG. 4, a voltage divider R is arranged in the emitter feeding line of transistor T. Diode D is located between point 17 of voltage divider R and point 16 of the base feeding line.

According to the modification of FIG. 5, instead of the voltage divider R of FIG. 4 the working or driving coil $L_2$ is located in the emitter feeding line of transistor T while at a suitable point 17 along coil $L_2$ there is connected one terminal of diode D. Between the base of transistor T and the positive pole of voltage source B there is located the control winding $L_1$. The circuit according to FIG. 5 represents a collector circuit and is known as an impedance converter. With this circuit, the control current also passes through the working coil $L_2$, and the voltage amplification is always less than 1.

The circuits illustrated in FIGS. 4 and 5 operate, fundamentally, in the same way as the circuit according to FIGS. 1 and 2. For purposes of illustrating the operation, reference may be had to the equivalent circuit of FIG. 6 and the diagrams of FIGS. 7 and 8. In FIG. 6, $R_2$ represents the ohmic resistance of control coil $L_1$; $R_4$ represents the ohmic resistance of the working coil $L_2$; $R_{10}$ and $R_{11}$ that of the voltage divider; $R_{12}$ represents the resistance of the base-emitter-diode in conducting direction, which resistance is variable with the applied voltage; $R_{13}$ represents the variable resistance of the collector-base-diode in conductive condition of the transistor; and $R_8$ represents the variable resistance of the semi-conductor diode D interposed between points 16 and 17 in conductive direction. The inner resistance of voltage source B may, in this consideration, be neglected. $E_I$ designates the voltage of the impulse voltage source in coil $L_1$, which is in series with resistance $R_2$.

The equivalent circuit shown in FIG. 6 applies to both of the circuits according to FIGS. 4 and 5. With the circuit according to FIG. 5, merely the working resistance $R_4$ becomes zero and, as indicated in FIG. 5, the working coil $L_2$ itself forms the two resistances $R_{10}$ and $R_{11}$ of the voltage divider in the emitter feeding line.

First there may be considered the operation of the circuit according to FIGS. 4 and 5 without the suggested compensation by diode D. If no control impulse or a control impulse with wrong polarity is present between the base and the emitter of transistor T, the latter will be blocked, which means that the resistance of the emitter-collector path is in comparison to the resistance of the working coil $L_2$ so high that practically the total voltage drop stands across the emitter-collector path of transistor T. If, however, the base in the present instant has a sufficiently high negative control potential applied thereto, a current increasing with increasing voltage will pass through the base-emitter-diode poled in the conductive direction and having the resistance $R_{12}$ until transistor T becomes conductive.

Figure 8:
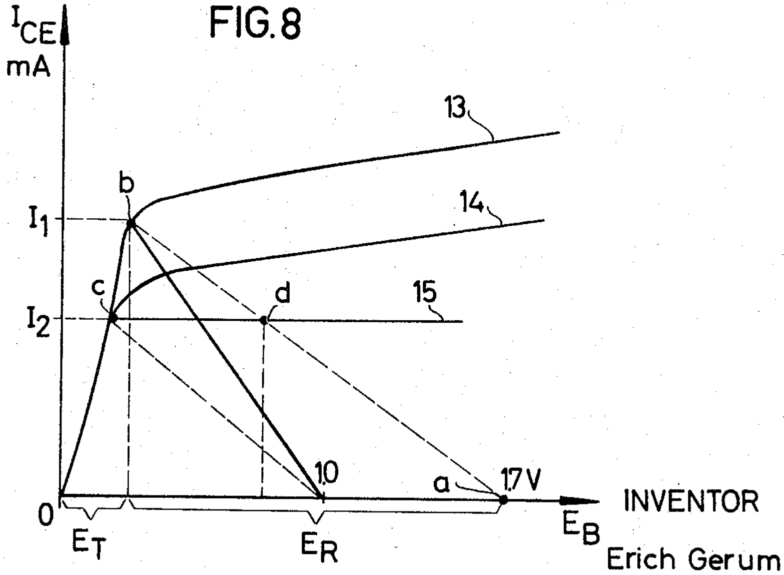
FIG. 8 is a further diagram of current-voltage-curves in explanation of the effect of the circuits according to FIGS. 4 and 5.

This working point in FIG. 8 is designated with the letter *b*. This working point under the conditions designated, is always located at the bend of the $E_B/I_{CE}$ characteristic line. Depending on the voltage of voltage source B, the maximum base current will vary, and, more specifically, will increase with increasing battery voltage.

In FIG. 7, curve 19 illustrates the course of the base current $I_{BE}$ independence on the voltage $E_B$. The variation of the base current with voltage $E_B$ can also be recognized in the current-voltage diagram of FIG. 8, in which, in conformity with the voltage $E_B$ of the voltage feeding source, there are shown the currents of two different voltages between base and emitter (curves 13 and 14) as they occur with a constant working resistance in the operating circuit. If, for instance, the battery has a voltage of 1.7 volts, this total voltage will, in blocked condition of the transistor, be applied to the resistances $R_{12}$ and $R_{13}$ while the current in the working resistance will be zero (point *a* in FIG. 8).

When a negative impulse voltage occurs at the base of the transistor T, the latter is made conductive so that now a current $I_1$ flows in the working resistance (point *b* of the characteristic line) while at the emitter-collector path of transistor T a voltage drop $E_T$ occurs and at the working resistance a voltage drop $E_R$ occurs.

When, in the course of time, the voltage of source B drops, for instance, to a value of 1 volt, the current, in the conductive condition at the transistor, will be $I_2$ in the working resistance in conformity with point *c* of the current-voltage characteristic 14. It is thus seen that the current passing through the working resistance has decreased in conformity with the decrease in the voltage of the direct voltage source.

If, in conformity with the present invention, a diode D having a resistance $R_8$ is provided, the following completely different conditions prevail. Up to a certain voltage on diode D, diode D is practically non-conductive or is only very slightly conductive. From this certain voltage on, however, which may be called lower limit voltage, the conductivity of diode D increases rapidly in conformity with curve 18 of FIG. 7, which represents the course of the diode current $I_D$, while the potential of point 16 and, thus, of the base of transistor T will, for all voltages of the source above the lower limit voltage, become the more positive relative to the emitter, the more the working current increases.

With the embodiments of FIGS. 4 and 5, similarly to the embodiment of FIGS. 1 and 2, the potential of point 17, on which the potential of point 16 depends, becomes the more positive the more the working current increases, since the voltage drop on resistance $R_{11}$ between the emitter and point 17 depends on the working current, and since the emitter, when the transistor T is conductive, is practically connected directly to the minus pole of the voltage source B. If, therefore, the working current tends to increase from a lower limit value which corresponds to the lower limit value of the voltage $E_B$ of the direct voltage source B (1 volt), the positive blocking potential on the base of transistor T will immediately increase so that the transistor will be blocked to a greater extent. This means that with a voltage $E_B$ increasing beyond 1 volt, the working point will not leave the line 15 (FIG. 8) which is parallel to the abscissa so that the working point will be located with $E_B=1.7$ volts at *d*. With increasing battery voltage, the additional voltage drop (to which corresponds the distance of the working point from the ordinate) will, similarly to the embodiment of FIGS. 1 and 2, be located practically completely at the emitter-collector path of the transistor T while the same current $I_2$ always flows in the working circuit.

The voltage divider provided in FIG. 4 consumes a portion of the power in the working circuit. Therefore, it is intended to keep the magnitude of this resistance as small as possible. This, however, requires a diode responsive to relatively low voltages.

More favorable are the conditions in the embodiment of FIG. 5 in which the working resistance itself is located in the emitter feeding line. In this instance, point 17 on working winding $L_2$ may be so selected that the start of the compensation will be effected from a certain voltage on. Advantageously, the resistance of the control coil $L_1$ is selected high relative to that of the working coil $L_2$ or expressed differently, the ohmic resistance of control coil $L_1$ is greater than the ohmic resistance of the voltage divider or the working coil $L_2$. With the circuit of FIG. 5, no voltage amplification occurs, however, in view of the relatively low resistance of the working coil $L_2$, a considerably higher current will flow in the working coil $L_2$ than in control coil $L_1$. The impedance of control coil $L_1$ must therefore be selected high so that a sufficiently high control voltage will occur at the base of transistor T.

When the minimum control voltage is exceeded, the transistor T becomes conductive, while, however, the magnitude of the working current is independent of the magnitude of the control voltage. Therefore, diode D brings about that the arrangement is, above a minimum voltage, completely insensitive to oscillations of the control voltage.

A further advantage of the circuits according to the present invention consists in that they are very nonsensitive to batch variations of the transistors and in that with a suitable selection of the diodes, complete temperature compensation can be realized. Thus, semi-conductor diodes may be employed, the temperature sensitivity of which approximately equals that of the transistor so that with increasing temperature and consequently increasing conductivity of the transistor, the conductivity of the diode will increase to the same extent.

With a proper selection of the characteristic of the semi-conductor diode D, in the examples of FIGURES 1, 2, and 5, the point 17 may also be located at that end of the working coil $L_2$ which is connected to the plus pole of the voltage source B.

The compensation circuit according to the invention is advantageous in all instances where a particularly stable and constant value of the emitter or collector current is imperative. This is the case in particular with impulse motors for driving clocks or with circuits for the direct drive of the regulator of a clock, for instance, a pendulum or a balance wheel, as shown in FIG. 2.

The connections suggested are, however, also suitable for the construction of toggle-switches and oscillating switches of all types with a feed-back between operating winding and control winding, or complete or part-existing separate excitation.

In the same manner the connections suggested can also be employed in high frequency systems, for example, with a tuning fork-controlled oscillator, or with systems in which, by means of piezo-electrical or piezo-ceramic substances, a constant oscillation amplitude must be obtained, which should be as independent as possible of the feed voltage.

The working or driver coil alone or the combination thereof with an ohmic resistance forms an impedance from which the compensating voltage is taken, either from the resistance or the coil. Conditions usually dictate that the portion of the load circuit from which the compensating voltage is taken be near the emitter and the voltage source is therefore found at the collector side of the load circuit.

In the circuits described, the transistor can be of germanium, silicon or other semi-conductive material. A germanium transistor is distinguished by a particularly small current consumption and favorable build-up ratio. The diode also can consist of germanium, silicon or other semi-conductive material. Very favorable conditions have been obtained by employing a germanium transistor in connection with a silicon diode. The silicon diode only results in a notable current from a relatively high voltage in direction of passage so that not until a certain battery voltage is exceeded does a compensation effect occur by means of the diode provided.

It is essential for the circuit amplifier according to the present invention that in view of the working current prevailing in the conductive state of the transistor, a voltage drop is produced in a relatively small resistance of a voltage divider and that at a definite point of this voltage drop there is connected a further resistor, for instance, a diode which is connected to the base of the transistor, and which above a certain terminal voltage and thereby above a predetermined voltage of operation forms a relatively low ohmic shunt with regard to the resistance of the base-emitter-diode or the collector-base-diode and with regard to the partial resistance of the voltage divider arranged in series therewith.

It is, of course, to be understood that the present invention is by no means limited to the particular arrangements shown in the drawing, but also comprises any modifications within the scope of the appended claims.

What I claim is:

1. A transistorized circuit for a mechanism having a movable member, especially for an electric clockwork, which comprises: a transistor having a base, an emitter, and a collector; a source of direct current in which the voltage declines over the life of the source; impedance means including a working coil; said direct current source and said impedance means being arranged in series between said collector and said emitter with at least a portion of the impedance being between the said source and the said emitter; said working coil being operable when supplied with current impulses from said source to impart driving impulses on said movable member; a control coil connected between said base and said emitter and operable in response to a movement of said member to supply controlling voltage pulses to said base to thereby control the conductivity of said transistor and the supply of current pulses to said working coil; and a diode which is nonconductive below a predetermined voltage less than the algebraic sum of the maximum voltage of said source and the voltage of the control pulses supplied to said base by said control coil; said diode being connected between said base and a point on said portion of impedance means which is spaced from said emitter; said diode being poled so as to be operable, when the voltage of said direct current source is above a predetermined minimum value, to supply a voltage from said source to said base at least during the period that a control pulse is supplied to said base by said control coil opposite in polarity to that of the control pulse supplied by said control coil.

2. A circuit according to claim 1, in which said diode has a pronounced bend in the current-voltage characteristic line and wherein said diode is poled in the same sense as the emitter-base connection of said transistor.

3. A circuit according to claim 1, in which said portion of said impedance means is said working coil and the connection of said diode resistor to said portion of said impedance means is to a point between the ends of said working coil.

4. A circuit according to claim 1, in which said portion of said impedance means is a resistor element and the point of connection of said diode to said impedance means is to a point between the ends of said resistor element.

5. A circuit according to claim 1, in which said impedance means in its entirety is arranged between said emitter and said direct current source.

6. A circuit according to claim 1, in which the ohmic resistance of said control coil is greater than the ohmic resistance of said impedance means.

7. A circuit according to claim 1, in which the impedance of said control coil is greater than that of said working coil.

8. A circuit according to claim 4, in which the current-voltage characteristic line of said diode varies in the same sense as that of said transistor whereby the circuit is compensated for variations in ambient temperature.

References Cited

UNITED STATES PATENTS

| | | | |
|---|---|---|---|
| 2,986,683 | 5/1961 | Lavet et al. | 318—132 |
| 3,117,265 | 1/1964 | Favre | 318—132 |
| 3,118,098 | 1/1964 | Reich | 318—132 X |

OTHER REFERENCES

Silicon Zener Diode Handbook—Motorola—1959, p. 108.

MILTON O. HIRSHFIELD, *Primary Examiner.*

D. F. DUGGAN, *Assistant Examiner.*